US012641926B2

(12) United States Patent
Kim et al.

(10) Patent No.: US 12,641,926 B2
(45) Date of Patent: May 26, 2026

(54) LIGHT-EMITTING DIODE AND DISPLAY MODULE USING THE SAME

(71) Applicant: SAMSUNG ELECTRONICS CO., LTD., Suwon-si (KR)

(72) Inventors: Myunghee Kim, Suwon-si (KR); Seungran Park, Suwon-si (KR); Youngki Jung, Suwon-si (KR); Chulgyu Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 786 days.

(21) Appl. No.: 17/702,414

(22) Filed: Mar. 23, 2022

(65) Prior Publication Data

US 2022/0376139 A1     Nov. 24, 2022

Related U.S. Application Data

(63) Continuation of application No. PCT/KR2021/016123, filed on Nov. 8, 2021.

(30) Foreign Application Priority Data

May 20, 2021     (KR) ........................ 10-2021-0064782

(51) Int. Cl.
| | |
|---|---|
| *H10H 20/831* | (2025.01) |
| *H10H 20/857* | (2025.01) |
| *H10W 90/00* | (2026.01) |

(52) U.S. Cl.
CPC ...... *H10H 20/8312* (2025.01); *H10H 20/857* (2025.01); *H10W 90/00* (2026.01)

(58) Field of Classification Search
CPC .............................. H01L 33/382; H01L 33/62
See application file for complete search history.

(56) References Cited

U.S. PATENT DOCUMENTS

| | | |
|---|---|---|
| 8,431,939 B2 | 4/2013 | Jeon et al. |
| 9,608,168 B2 | 3/2017 | Chae |
| (Continued) | | |

FOREIGN PATENT DOCUMENTS

| | | |
|---|---|---|
| JP | 2018-78310 A | 5/2018 |
| KR | 10-2006-0102657 A | 9/2006 |
| (Continued) | | |

OTHER PUBLICATIONS

International Search Report (PCT/ISA/237) issued Feb. 17, 2022 by the International Searching Authority in counterpart International Patent Application No. PCT/KR2021/016123.

(Continued)

*Primary Examiner* — Julio J Maldonado
*Assistant Examiner* — Hajar Kolahdouzan
(74) *Attorney, Agent, or Firm* — Sughrue Mion, PLLC

(57)          ABSTRACT

A light-emitting diode and a display module using the same is disclosed. The light-emitting diodes includes a first semiconductor layer, an active layer provided on the first semiconductor layer, a second semiconductor layer provided on the active layer, a first chip electrode covering a first portion of an upper surface of the second semiconductor layer and a portion of a first side surface of the second semiconductor layer, and a second chip electrode covering a second portion of the upper surface of the second semiconductor layer different from the first portion of the upper surface of the second semiconductor layer and covering a second side surface of the second semiconductor layer different from the first side surface of the second semiconductor layer.

15 Claims, 14 Drawing Sheets

(56) References Cited

U.S. PATENT DOCUMENTS

| | | | |
|---|---|---|---|
| 9,825,202 B2 | 11/2017 | Schuele et al. | |
| 9,865,577 B2 | 1/2018 | Bibl et al. | |
| 10,297,720 B2 | 5/2019 | Chae et al. | |
| 10,431,718 B2 | 10/2019 | Crowder et al. | |
| 10,593,049 B2 | 3/2020 | Hollander et al. | |
| 10,768,660 B2 | 9/2020 | Lim et al. | |
| 2011/0133221 A1 | 6/2011 | Choi et al. | |
| 2019/0181304 A1 | 6/2019 | Sasaki et al. | |
| 2020/0184884 A1 | 6/2020 | Kau et al. | |
| 2020/0350464 A1 | 11/2020 | Shin et al. | |
| 2021/0028337 A1 | 1/2021 | Yan et al. | |
| 2021/0111168 A1 | 4/2021 | Jung et al. | |
| 2021/0358896 A1* | 11/2021 | Lee | H01L 24/26 |
| 2022/0115563 A1* | 4/2022 | He | H10H 20/831 |
| 2023/0045618 A1* | 2/2023 | Kim | H10H 20/832 |

FOREIGN PATENT DOCUMENTS

| | | | |
|---|---|---|---|
| KR | 10-1020424 B1 | 3/2011 | |
| KR | 10-2011-0078642 A | 7/2011 | |
| KR | 10-2016-0002149 A | 1/2016 | |
| KR | 10-2019-0000058 A | 1/2019 | |
| KR | 10-2019-0073675 A | 6/2019 | |
| KR | 10-1973855 B1 | 8/2019 | |
| KR | 10-2235292 B1 | 4/2021 | |
| WO | WO-2021087686 A1 * | 5/2021 | H01L 21/78 |

OTHER PUBLICATIONS

Written Opinion (PCT/ISA/237) issued Feb. 17, 2022 by the International Searching Authority in International Patent Application No. PCT/KR2021/016123.

Communication issued May 28, 2024 by the European Patent Office in the European Patent Application No. 21940942.2.

Communication issued Mar. 17, 2025 by Intellectual Property India in Indian Patent Application No. 202317065280.

Communication issued Sep. 16, 2025 by the European Patent Office in European Patent Application No. 21940942.2.

Communication issued on Nov. 28, 2025 by the Indian Patent Office in Indian Patent Application No. 202317065280.

Communication dated Feb. 5, 2026 issued by the Korean Ministry of Intellectual Property in Korean Patent Application No. 10-2021-0064782.

* cited by examiner

LIGHT-EMITTING DIODE AND DISPLAY MODULE USING THE SAME

CROSS-REFERENCE TO RELATED APPLICATIONS

This application is a bypass continuation of International Application No. PCT/KR2021/016123, filed on Nov. 8, 2021, which is based on and claims priority to Korean Patent Application No. 10-2021-0064782, filed on May 20, 2021, in the Korean Intellectual Property Office, the disclosures of which are incorporated by reference herein in their entireties.

BACKGROUND

1. Field

The disclosure relates to a light-emitting diode and a display module using the same. More particularly, the disclosure relates to methods, apparatuses and systems for transferring a light-emitting diode to a substrate through a fluidic self-assembly method.

2. Description of the Related Art

In a related art technique using a pick-and-place method, when an ultra-small light-emitting diode (LED) chip (e.g., an LED chip of 100 μm or less) is transferred to a thin film transfer (TFT) substrate, wavelength uniformity over the entire area of the substrate is poor after the transfer. As such, display performance is deteriorated, and manufacturing cost increases as a process time increases.

Recently, a micro-LED chip is transferred to a substrate using a fluidic self-assembly method to improve display yield and reduce process time.

SUMMARY

According to the disclosure, it is possible to provide a display module having a light-emitting diode applicable to a substrate for fluid self-assembly and a substrate capable of easily bonding a light-emitting diode to the substrate.

According to an aspect of the disclosure, there is provided a light-emitting diode including: a first semiconductor layer; an active layer provided on the first semiconductor layer; a second semiconductor layer provided on the active layer; a first chip electrode covering a first portion of an upper surface of the second semiconductor layer and a portion of a first side surface of the second semiconductor layer; and a second chip electrode covering a second portion of the upper surface of the second semiconductor layer different from the first portion of the upper surface of the second semiconductor layer and covering a second side surface of the second semiconductor layer different from the first side surface of the second semiconductor layer.

The first chip electrode may include: a first portion covering the first portion of the upper surface of the second semiconductor layer; a second portion extending from the first portion of the first chip electrode and covering the first side surface of the second semiconductor layer; and a third portion extending from the first portion of the first chip electrode and connected to the first semiconductor layer.

The second portion may be configured to extend to a side of the active layer or a side of the first semiconductor layer.

The light-emitting diode may further include an insulating layer provided between the third portion of the first chip electrode and the second semiconductor layer and between the third portion of the first chip electrode and the active layer such that the third portion is not in direct contact with the second semiconductor layer and the active layer.

The third portion has a length equal to or greater than a combined height of the second semiconductor layer and the active layer such that the third portion reaches the first semiconductor layer.

The second chip electrode may include: a first portion covering the second portion of the upper surface of the second semiconductor layer; and a second portion extending from the first portion of the second chip electrode and covering the second side surface of the second semiconductor layer.

The light-emitting diode may further include an insulating film covering the upper surface of the second semiconductor layer and a side surface of the second semiconductor layer, and wherein the second chip electrode may further include a third portion extending from the first portion of the second chip electrode and connected to the second semiconductor layer through the insulating film.

The first chip electrode and the second chip electrode may be asymmetrically disposed with respect to the light-emitting diode.

The first chip electrode and the second chip electrode may be symmetrically disposed with respect to the light-emitting diode.

According to an aspect of the disclosure, there is provided a display module including: a substrate having a plurality of mounting grooves on one surface; a plurality of light-emitting diodes configured to emit light and respectively mounted in the plurality of mounting grooves; and a driving circuit configured to generate driving signals of the plurality of light-emitting diodes, wherein each of the plurality of light-emitting diodes includes: a first semiconductor layer and a second semiconductor layer, an active layer provided between the first semiconductor layer and the second semiconductor layer, a first chip electrode covering a first portion of an upper surface of the second semiconductor layer and a portion of a first side surface of the second semiconductor layer, and a second chip electrode covering a second portion of the upper surface of the second semiconductor layer different from the first portion of the upper surface of the second semiconductor layer and covering a second side surface of the second semiconductor layer different from the first side surface of the second semiconductor layer, and wherein each of the plurality of mounting grooves includes a first substrate electrode pad to which the first chip electrode is electrically connected, and a second substrate electrode pad to which the second chip electrode is electrically connected.

The first substrate electrode pad may include a first portion provided around one side of the respective mounting groove, and a second portion extending to the first portion and extending to an inner circumferential surface of the respective mounting groove.

The first portion or the second portion of the first substrate electrode pad may be configured to be electrically connected to the first chip electrode.

The second substrate electrode pad may include a first portion provided around one side of the respective mounting groove, and a second portion extending to the first portion and extending to an inner circumferential surface of the respective mounting groove.

The first portion or the second portion of the first substrate electrode pad may be configured to be electrically connected to the second chip electrode.

A portion of the first substrate electrode pad that may not be electrically connected to the first chip electrode and may be configured to be covered by an insulating film, and a portion of the second substrate electrode pad may not be electrically connected to the second chip electrode and may be configured to be covered by the insulating film.

DETAILED DESCRIPTION

Figure 1:
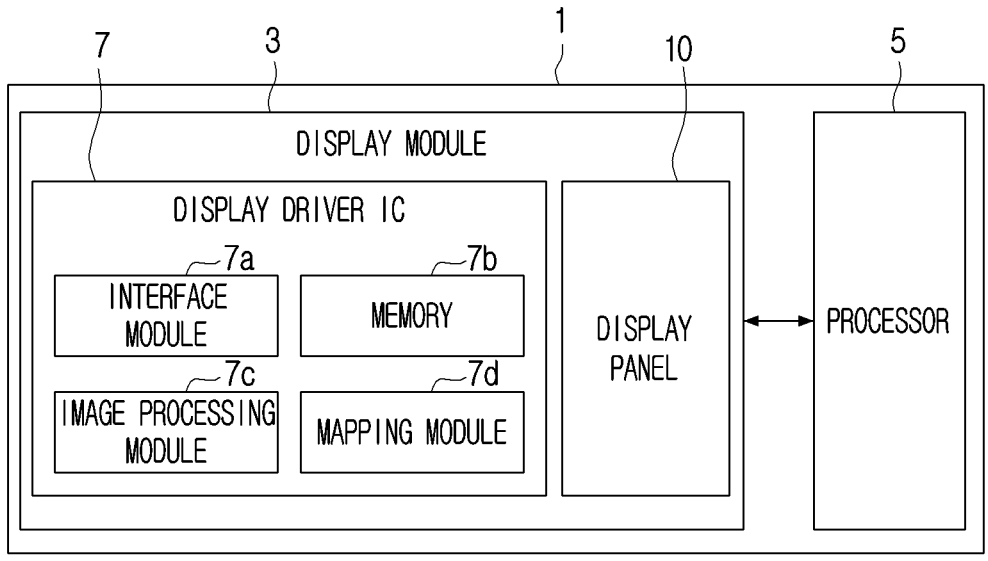
FIG. 1 is a block view illustrating an electronic apparatus including a display module according to various embodiments.

The terms used in example embodiments will be briefly explained, and example embodiments will be described in greater detail with reference to the accompanying drawings. In describing the disclosure, a detailed description of a related known technology may be omitted, and a duplicate description of the same configuration will be omitted as much as possible.

Terms used in the disclosure are selected as general terminologies currently widely used in consideration of the configuration and functions of the disclosure, but can be different depending on intention of those skilled in the art, a precedent, appearance of new technologies, or the like. Further, in specific cases, terms may be arbitrarily selected. In this case, the meaning of the terms will be described in the description of the corresponding embodiments. Accordingly, the terms used in the description should not necessarily be construed as simple names of the terms, but be defined based on meanings of the terms and overall contents of the disclosure.

The example embodiments may vary, and may be provided in different example embodiments. Various example embodiments will be described with reference to accompanying drawings. However, this does not necessarily limit the scope of the exemplary embodiments to a specific embodiment form. Instead, modifications, equivalents and replacements included in the disclosed concept and technical scope of this specification may be employed. While describing exemplary embodiments, if it is determined that the specific description regarding a known technology obscures the gist of the disclosure, the specific description is omitted.

The term such as "first" and "second" used in various example embodiments may modify various elements regardless of an order and/or importance of the corresponding elements, and does not limit the corresponding elements. The terms are only used to differentiate one component from other components. For example, the 'first' component may be named the 'second' component, and vice versa, without departing from the scope of the disclosure.

Singular forms are intended to include plural forms unless the context clearly indicates otherwise. The terms "include", "comprise", "is configured to," etc., of the description are used to indicate that there are features, numbers, steps, operations, elements, parts or combination thereof, and they should not exclude the possibilities of combination or addition of one or more features, numbers, steps, operations, elements, parts or a combination thereof.

In the disclosure, a 'module' or a 'unit' performs at least one function or operation and may be implemented by hardware or software or a combination of the hardware and the software. In addition, a plurality of 'modules' or 'units' may be integrated into at least one module and may be realized as at least one processor in an integrated manner except for 'modules' or 'units' that should be realized in specific hardware.

According to an embodiment, a display module may include a display panel. The display panel is one of flat panel display panels, and a plurality of inorganic light-emitting diodes (inorganic LEDs) each having a size of 100 μm or less may be arranged. Compared to liquid crystal display (LCD) panels that require backlighting, micro LED display modules offer better contrast, response time and energy efficiency. Moreover, while organic light-emitting diodes (OLEDs) and inorganic light-emitting diodes (i.e., micro LEDs), have high energy efficiency, micro LEDs are brighter, have better luminous efficiency, and have longer lifespan than OLEDs. A micro LED may be a semiconductor chip that can emit light by itself when power is supplied. The micro LED has fast response speed, low power, and high luminance. Specifically, the micro LED has a higher efficiency of converting electricity into photons than a related art liquid crystal display (LCD) or organic light-emitting diode (OLED). In other words, it has a higher "brightness per watt" compared to related art LCD or OLED displays. Accordingly, the micro LED may produce the same brightness with about half the energy compared to the related art LED (each exceeding 100 μm in width, length, and height) or OLED. In addition, the micro LED may realize high resolution, excellent color, contrast and brightness, and thus it may accurately express a wide range of colors, and may implement a clear screen even outdoors in bright sunlight. In addition, the micro LED may be strong against burn-in and has low heat generation, and thus a long lifespan is guaranteed without deformation.

According to an embodiment, The micro LED may have a flip chip structure in which an anode electrode and a cathode electrode are formed on the same first surface, and a light-emitting surface is formed on a second surface opposite to the first surface on which the electrodes are formed.

According to another embodiment, in the micro LED, the anode electrode and the cathode electrode may be respectively provided on the light-emitting surface of the micro LED. In this case, in the micro LED, the anode electrode and the cathode electrode may be positioned on opposite sides.

According to another embodiment, in the micro LED, the anode electrode and the cathode electrode may be disposed on a light-emitting surface and a side surface of the micro LED, respectively. In this case, the anode electrode of the micro LED may extend from the light-emitting surface to the side surface, and the cathode electrode of the micro LED may also extend from the light-emitting surface to the side surface. In this case, in the micro LED, the anode electrode and the cathode electrode may be positioned on opposite sides.

A glass substrate may have a TFT layer in which a thin film transistor (TFT) circuit is formed on a front surface, and a driving circuit for driving the TFT circuit may be disposed on the rear surface. The TFT circuitry may drive a plurality of pixels disposed in the TFT layer.

The front surface of the glass substrate may be divided into an active area and an inactive area. The active area may correspond to an area occupied by the TFT layer on the front surface of the glass substrate, and the inactive area may be an area excluding the area occupied by the TFT layer on the front surface of the glass substrate.

An edge area of the glass substrate may be an outermost portion of the glass substrate. Also, the edge area of the glass substrate may be an area remaining except for an area in which a circuit of the glass substrate is formed. Also, the edge area of the glass substrate may include a side surface of the glass substrate, a front portion of the glass substrate adjacent to the side surface, and a portion of the rear surface of the glass substrate. The glass substrate may be formed in a quadrangle type. Specifically, the glass substrate may be formed in a rectangular shape or a square shape. The edge area of the glass substrate may include at least one side of four sides of the glass substrate.

The substrate applied to the display module according to various embodiments of the disclosure is not necessarily limited to a glass substrate, and may be a polymer substrate (e.g., a polyimide substrate, etc.) or a ceramic substrate.

The display module according to various embodiments of the disclosure may be installed and applied to a wearable device, a portable device, a handheld device, and an electronic product or an electric field requiring various displays, and may be applied to a monitor for a personal computer (PC), a high-resolution TV, and a signage (or digital signage), a display device such as an electronic display through a plurality of assembly arrangements in a matrix type.

The example embodiments of the disclosure will be described in greater detail below in a manner that will be understood by those skilled in the art. However, exemplary embodiments may be realized in a variety of different configurations, and not limited to descriptions provided herein. In addition, well-known functions or constructions are not described in detail since they would obscure the invention with unnecessary detail.

Further, although embodiments of the disclosure will be described in detail below with reference to the accompanying drawings and the contents described in the accompanying drawings, the disclosure is not limited or limited by the embodiments.

Hereinafter, a display method according to various embodiments of the disclosure will be described with reference to the accompanying drawings.

FIG. 1 is a block view illustrating an electronic apparatus including a display module according to various embodiments.

Referring to FIG. 1, a display device 1 according to an embodiment of the disclosure includes a display module 3 and a processor 5.

The display module 3 according to an embodiment of the disclosure may display various images. Here, an image may include a still image and/or a moving image. The display module 3 may display various images such as broadcast content and multimedia content. Also, the display module 3 may display a user interface (UI) and an icon.

The display module 3 may include a display panel 10, and a display driver Integrated Circuit (IC) (DDI) 7 for controlling the same.

The display driver IC 7 may include an interface module 7a, a memory 7b, an image processing module 7c, and a mapping module 7d. The memory 7b may include a buffer memory according to an embodiment. The display driver IC 7 may transmit, for example, image data or image information including an image control signal corresponding to a command for controlling the image data from other components of the display device 1 through the interface module 7a. For example, according to an embodiment, the image information may be received from the processor 5 (e.g., a main processor (e.g., an application processor) or an auxiliary processor (e.g., a graphic processing unit) that operates independently of a function of the main processor.

The display driver IC 7 may communicate through a sensor module and an interface module 7a. Also, the display driver IC 7 may store at least a portion of the received image information in the memory 7b, for example, in units of frames. The image processing module 7c may, for example, pre-process or post-process at least a portion of the image data based on at least a characteristic of the image data or a characteristic of the display panel 10 (e.g., adjusting resolution, brightness, or size). The mapping module 7d may generate a voltage value or a current value corresponding to the image data pre-processed or post-processed through the image processing module 7c. According to an embodiment, a generation of the voltage value or the current value may be performed based at least in part on a property of pixels of the display panel 10 (e.g., an arrangement of pixels (RGB stripe or PenTile structure), or a size of each sub-pixel). At least some pixels of the display panel 10 may be driven based at least in part on the voltage value or the current value, such that visual information (e.g., text, image, or icon) corresponding to the image data may be displayed through the display panel 10.

The display driver IC 7 may transmit a driving signal (e.g., a driver driving signal, a gate driving signal, etc.) to the display based on the image information received from the processor 5.

The display driver IC 7 may display an image based on the image signal received from the processor 5. For example, the display driver IC 7 may generate a driving signal of a plurality of sub-pixels based on an image signal received from the processor 5, and display an image by controlling light emission of the plurality of sub-pixels based on the driving signal.

The display module 3 may further include a touch circuit. The touch circuit may include a touch sensor and a touch sensor IC for controlling the touch sensor. The touch sensor IC, for example, may control the touch sensor to detect a touch input or a hovering input for a designated position of the display panel 10. For example, the touch sensor IC may detect the touch input or the hovering input by measuring a change in a signal (e.g., voltage, light amount, resistance, or electric charge amount) for a designated position of the display panel 10. The touch sensor IC may provide information (e.g., position, area, pressure, or time) regarding the detected touch input or hovering input to the processor 13. According to an embodiment, at least a part of the touch circuit (e.g., a touch sensor IC) may be a part of the display driver IC 7, or may be included as a part of other components (e.g., auxiliary processor) disposed outside of the display module 3

The processor 5 may be implemented as a digital signal processor (DSP), a microprocessor, a graphics processing unit (GPU), an artificial intelligence (AI) processor, a neural processing unit (NPU) for processing a digital image signal, a time controller (TCON), but is not limited thereto, and may include one or more of a central processing unit (CPU), micro controller unit (MCU), micro processing unit (MPU), controller, an application processor (AP), a communication processor (CP), an ARM processor, or may be defined by the corresponding term. The processor 5 may be implemented as a system on chip (SoC), large scale integration (LSI) with a built-in processing algorithm, or as an application specific integrated circuit (ASIC) or field programmable gate array (FPGA) type.

The processor 5 may, for example, control a number of hardware or software elements connected to the processor 5 by driving an operating system or application program, and perform various data processing and calculations. Further, the processor 5 may load and process a command or data received from at least one of the other components to a volatile memory and store diverse data in a non-volatile memory.

Figure 2:
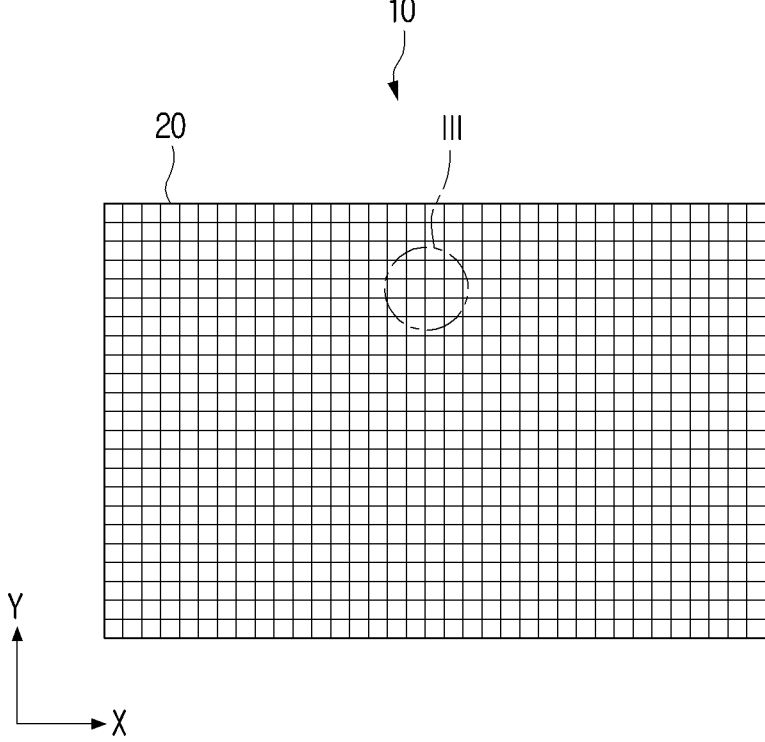
FIG. 2 is a view illustrating a display panel according to an embodiment.
Figure 3:
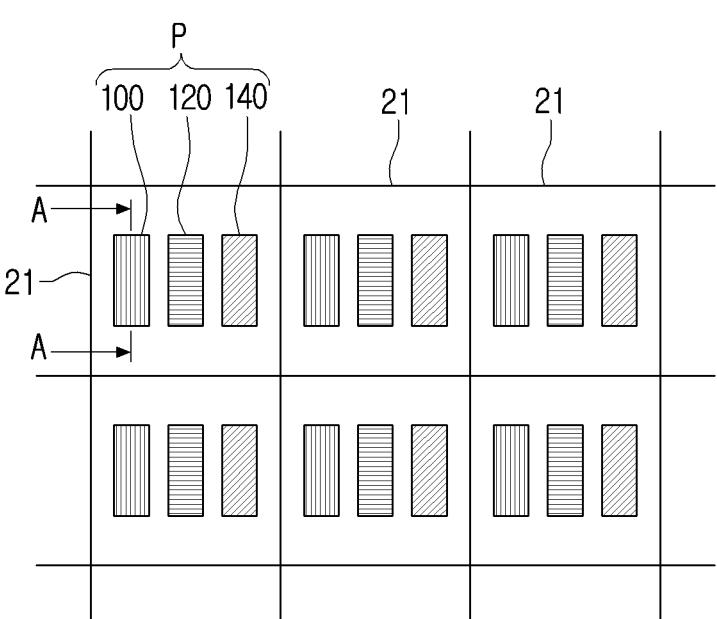
FIG. 3 is an enlarged view illustrating a pixel of a display panel by enlarging a III portion shown in FIG. 2.
Figure 4:
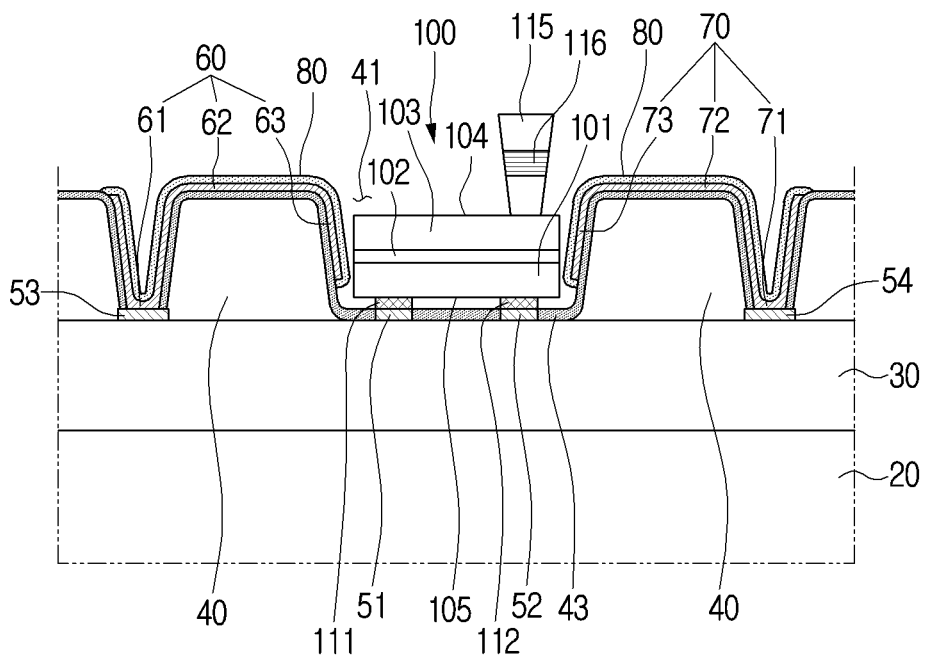
FIG. 4 is a cross-sectional view taken along a line A-A shown in FIG. 3.

FIG. 2 is a view illustrating a display panel according to an embodiment, FIG. 3 is an enlarged view illustrating a pixel of a display panel by enlarging a III portion shown in FIG. 2, and FIG. 4 is a cross-sectional view taken along a line A-A shown in FIG. 3.

Referring to FIGS. 2 and 3, the display panel 10 may include a plurality of pixels P arranged on a substrate 20.

The display panel 10 may include a plurality of pixel areas 21 arranged in a matrix form. One pixel P may be disposed in each pixel area 21, and one pixel P may include a first sub-pixel 100 emitting red light, a second sub-pixel 120 emitting green light, and a third sub pixel 140 emitting blue light.

In an area 21, a plurality of thin film transistors (TFTs) may be disposed in an area not occupied by the first sub-pixel 100, the second sub-pixel 120 and the sub-pixel 140, for driving the first sub-pixel 100, the second sub-pixel 120 and the sub-pixel 140.

The display module 3 according to an embodiment of the disclosure may be a touch screen combined with a touch sensor, a flexible display, a rollable display, or a three-dimensional display (3D display). In addition, a large display may be implemented by providing a plurality of display modules according to an embodiment of the disclosure and physically connecting the modules.

According to various embodiments, the display panel 10 may include a substrate that can be implemented in the form of amorphous silicon (a-Si) TFT, a low temperature polycrystalline silicon (LTPS) TFT, low temperature polycrystalline oxide (LTPO) TFT, hybrid oxide and polycrystalline silicon (HOP) TFT, a liquid crystalline polymer (LCP) TFT, an organic TFT (OTFT), or the like.

Referring to FIG. 4, the display panel 10 may include a substrate 20 and a TFT layer 30 provided on the substrate 20.

A plurality of mounting grooves 41 may be provided on a mounting surface of the substrate 20 (e.g., an upper surface of the TFT layer 30). A plurality of mounting grooves 41 corresponding to a plurality of sub-pixels constituting one pixel P may be provided in one pixel area 21. For example, when three sub-pixels 100, 120, and 140 are disposed in one pixel area 21 as illustrated in FIG. 3, three mounting grooves 41 may be provided.

The mounting groove 41 may be formed in an insulating layer 40 stacked on the TFT layer 30. The insulating layer 40 may be formed of an organic material or an inorganic material. Alternatively, the insulating layer 40 may have a structure in which at least an organic layer and at least one inorganic layer are stacked. Alternatively, the insulating layer 40 may have a structure in which inorganic layers and organic layers are alternately stacked.

A protective film 43 for protecting the insulating layer 40 from external impact may be stacked on the insulating layer 40. The protective layer 43 may be composed of an organic material. The protective layer 43 may be optionally provided and may be omitted if necessary.

The mounting groove 41 may be formed in the insulating layer 40 to a particular depth through an etching process or the like. The particular depth being a predetermined depth. According to an embodiment, the light-emitting diode 100 may be provided in the mounting groove 41. In the light-emitting diode 100 inserted into the mounting groove 41, a post 115 may protrude out of the mounting groove 41. A first substrate electrode pad 51 and a second substrate electrode pad 52 may be disposed on a bottom of the mounting groove 41. In this case, the bottom of the mounting groove 41 may be an upper surface of the TFT layer 30.

According to an embodiment, the first substrate electrode pad 51 may be an anode substrate electrode pad, and the second substrate electrode pad 52 may be a cathode substrate electrode pad.

The first substrate electrode pad 51 may be connected to the first chip electrode 111 of the light-emitting diode 100. According to an embodiment, a solder ball or solder paste may be applied on the first substrate electrode pad 51 to enable electrical connection and physical connection. Accordingly, the first substrate electrode pad 51 may be electrically and physically interconnected to the first chip electrode 111 of the light-emitting diode 100 through the solder ball or solder paste.

The second substrate electrode pad 52 may be connected to the second chip electrode 112 of the light-emitting diode 100. The second substrate electrode pad 52 may be electrically and physically connected to the second chip electrode 112 of the light-emitting diode 100 in the same manner as the first substrate electrode pad 51.

The first substrate electrode pad 51 may be electrically connected to a gate electrode wiring 53 provided in the TFT layer 30, for example. In this case, the second substrate electrode pad 52 may be electrically connected to a common electrode wiring 54 provided in the TFT layer 30.

A third substrate electrode pad 60 and a fourth substrate electrode pad 70 corresponding to each mounting groove 41 may be formed on the substrate 20 such that the light-emitting diode may be electrically connected for repair. That is, the third and fourth substrate electrode pads 60 and 70 may be substrate electrode pads for repairing.

The third substrate electrode pad 60 may be formed on the insulating layer 40. In the third substrate electrode pad 60, a first portion 61 may be electrically connected to a gate electrode wiring 53, a second portion 62 may be disposed at a periphery of the mounting groove 41, and a third portion 63 may be formed to extend from the second portion 62 to a sidewall of the mounting groove 41.

The second portion 62 and the third portion 63 of the third substrate electrode pad 60 may be selectively used according to a type or shape of the micro LED for repair. For example, the second part 62 or the third part 63 of the third substrate electrode pad 60 may be used in consideration of a position of the first chip electrode of the micro LED for repair.

The fourth substrate electrode pad 70 may be formed on the insulating layer 40 like the third substrate electrode pad 60. In this case, the fourth substrate electrode pad 70 may be disposed symmetrically with the third substrate electrode pad 60 with respect to a center of the mounting groove 41. Alternatively, the third substrate electrode pad 60 and the fourth substrate electrode pad 70 may be respectively disposed on both sides of the mounting groove 41 in a non-symmetrical arrangement.

In the fourth substrate electrode pad 70, a first portion 71 may be electrically connected to the common electrode wiring 54, the second portion 72 may be disposed at the periphery of the mounting groove 41, and the third portion 73 may be formed to extend from a second part 72 to the sidewall of the mounting groove 41.

The fourth substrate electrode pad 70, like the third substrate electrode pad 60, the second part 72 and a third part 73 may be selectively used according to the type or shape of the micro LED for repair. For example, the second part 72 or the third part 73 of the fourth substrate electrode pad 70 may be used in consideration of the position of the second chip electrode of the repair micro LED.

The third and fourth substrate electrode pads 60 and 70 may be covered by an insulating layer 80 to prevent undesirable electrical connection to other electronic apparatuses or the like when not in use.

The light-emitting diode 100 may be a flip-type light-emitting diode in which a p-type semiconductor layer 101, an active layer 102, and an n-type semiconductor layer 103 are sequentially stacked, and first and second chip electrodes 111 and 112 are disposed on a surface 105 opposite to the light-emitting surface 104.

The light-emitting diode 100 may include a post 115 having a magnetic layer 116 to be inserted into the mounting groove 41 by itself by a magnetic field applied to the substrate 20 during fluid self-assembly. In this case, the post 115 may protrude from the light-emitting surface 104 of the light-emitting diode 100 by a predetermined length. The magnetic layer 116 included in the post 115 may be a diamagnetism (e.g., Ge) or a material having magnetic properties (e.g., Cr, Mn, Fe, Co, Ni, Cu). The post 115 may be positioned on the light-emitting surface 104 and may be disposed to be biased toward one side of the light-emitting surface 104 as illustrated in FIG. 3. Accordingly, during fluid self-assembly, a posture may be aligned and mounted such that the first chip electrode 111 may correspond to the first substrate electrode pad 51 and the second chip electrode 112 corresponds to the second substrate electrode pad 52 by the magnetic field and may be inserted into the groove 41. In addition, the light-emitting diode 100 may be prevented from being inserted into the mounting groove 41 in a posture in which the light-emitting surface 104 faces a bottom of the mounting groove 41 by the posts 115.

The post 115 may be removed from the light-emitting diode 100 through a separate process after the light-emitting diode 100 is mounted in the mounting groove 41.

After transferring a plurality of micro LEDs to the substrate 20, a thermocompression process may be performed. In this case, the first and second chip electrodes 111 and 112 may form a metal bonding state in which they are fused with the first and second substrate electrode pads 51 and 52 by applied heat.

Hereinafter, the disclosure will be described in greater detail with reference to the accompanying drawings.

Figure 5:
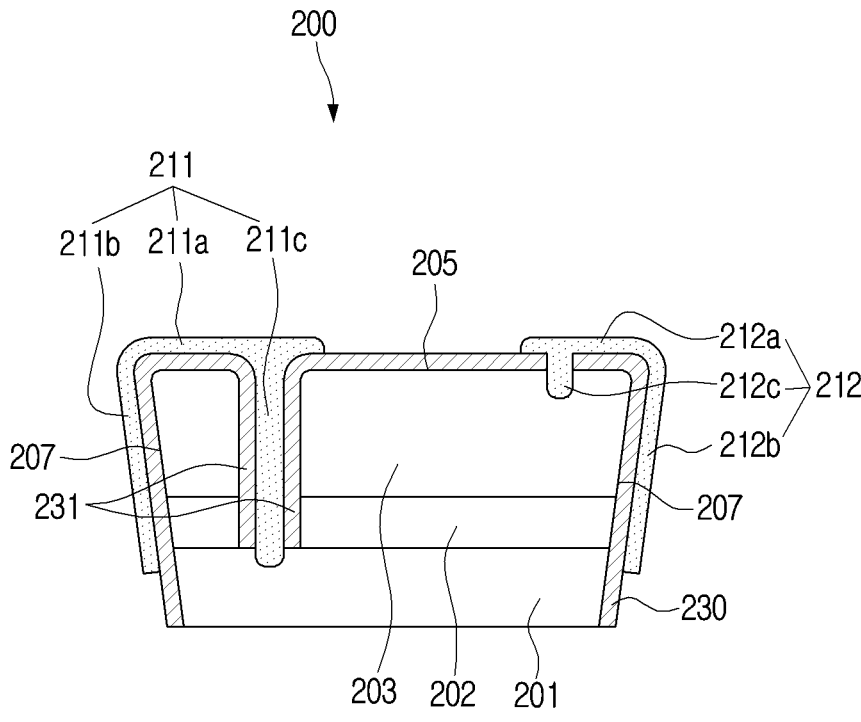
FIG. 5 is a cross-sectional view illustrating a light-emitting diode according to an embodiment.
Figure 6:
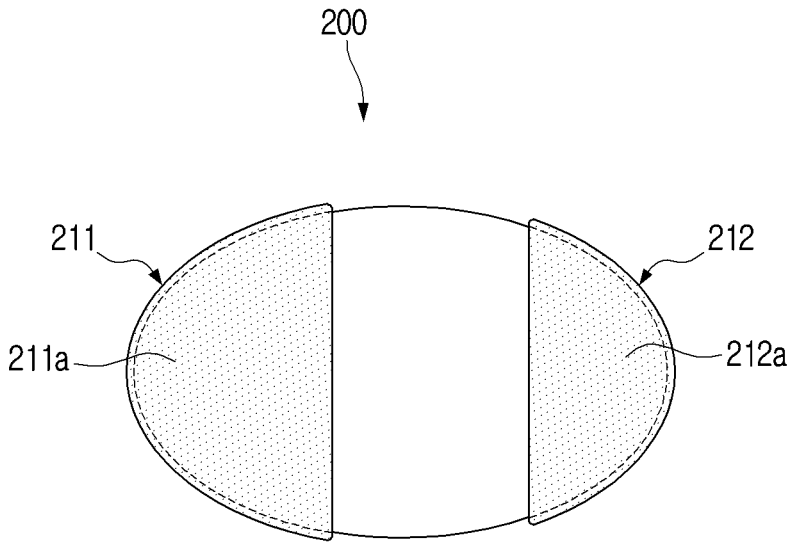
FIG. 6 is a plan view illustrating a light-emitting diode according to an embodiment.

FIG. 5 is a cross-sectional view illustrating a light-emitting diode according to an embodiment, and FIG. 6 is a plan view illustrating a light-emitting diode according to an embodiment.

Referring to FIGS. 5 and 6, the light-emitting diode 200 may include a first semiconductor layer 201, an active layer 202, and a second semiconductor layer 203 that are sequentially stacked, and may include a first chip electrode 211 and a second chip electrode 212.

The first semiconductor layer 201 may include, for example, a p-type semiconductor layer (anode, oxide electrode). The p-type semiconductor layer may be selected from, for example, GaN, AlN, AlGaN, InGaN, InN, InAlGaN, AlInN, or the like, and may be doped with a p-type dopant such as Mg, Zn, Ca, Sr, or Ba.

The second semiconductor layer 203 may include, for example, an n-type semiconductor layer (cathode, reduction electrode). The n-type semiconductor layer may be selected from, for example, GaN, AlN, AlGaN, InGaN, InN, InAlGaN, AlInN, or the like, and may be doped with an n-type dopant such as Si, Ge, Sn, or the like.

The light-emitting diode 200 is not limited to the configuration described above, and for example, the first semiconductor layer 201 may include an n-type semiconductor layer, and the second semiconductor layer 203 may include a p-type semiconductor layer.

The active layer 202 is an area in which electrons and holes recombine, and as the electrons and holes recombine, the active layer 202 may transition to a low energy level, and may generate light having a corresponding wavelength. The active layer 202 may include a semiconductor material, such as amorphous silicon or poly crystalline silicon. However, the present embodiment is not limited thereto, and may contain an organic semiconductor material or the like, and may be formed in a single quantum well (SQW) structure or a multi quantum well (MQW) structure.

The first chip electrode 211 is for an electrical connection between the first semiconductor layer 201 and the third substrate electrode pad 60, and may cover a part of the upper surface and a part of the side surface 207 of the light-emitting diode 200. Here, the upper surface of the light-emitting diode 200 may correspond to the upper surface of the second semiconductor layer 203 as a light-emitting surface 205. The side surface of the light-emitting diode 200 may correspond to each side surface of the first semiconductor layer 201, the active layer 202, and the second semiconductor layer 203.

The first chip electrode 211 may be composed of indium tin oxide (ITO), which is a transparent electrode, or an alloy containing Au or an alloy containing Au composed of a thin film to minimize interference of light emitted from the light-emitting diode 200.

The first chip electrode 211 may include a first portion 211a and a second portion 211b that may be electrically connected to the third substrate electrode pad 60, and may include a third portion 211c connected to the first semiconductor layer 201.

The first portion 211a of the first chip electrode 211 may cover a portion of the upper surface of the first semiconductor layer 201. The first portion 211a of the first chip electrode 211 may be electrically connected to the second portion 62 of the third substrate electrode pad 60 through a first wiring 311 (refer to FIG. 10). The first wiring 311 may be deposited in the form of a thin film on the first portion 211a of the first chip electrode 211 and the second portion 62 of the third substrate electrode pad 60. The first wiring 311 may be Au or an alloy containing Au.

The second portion 211b of the first chip electrode 211 may extend to the first portion 211a to cover side surfaces of the first semiconductor layer 201, the active layer 202, and the second semiconductor layer 203. The second portion 211b of the first chip electrode 211 may be electrically connected to the third portion 63 of the third substrate electrode pad 60 (refer to FIG. 9). As such, the second portion 211b of the first chip electrode 211 may have a length that can cover only the first semiconductor layer 201 or may have a length that can cover only the active layer 202. For example, a length of the second portion 211b of the first chip electrode 211 is sufficient to be electrically connected to the third portion 63 of the third substrate electrode pad 60. That is, the second portion 211b of the first chip electrode 211 may extend from a side of the second semiconductor layer 203 to a side of the first semiconductor layer 201 or only to a side of the active layer 202.

The third portion 211c of the first chip electrode 211 may extend to the first portion 211a to be connected to the first semiconductor layer 201. In this case, the third portion 211C of the first chip electrode 211 may have a length extending through the second semiconductor layer 203 and the active layer 202 to the first semiconductor layer 201. In this case, as the third portion 211c of the first chip electrode 211 is isolated from the second semiconductor layer 203 and the active layer 202 by a passivation layer 230, electrical contact is not made.

The second chip electrode 212 is for electrical connection between the second semiconductor layer 203 and the fourth substrate electrode pad 70, and cover a portion of an upper surface (light-emitting surface 205) of the light-emitting diode 200 and a portion of the side surface 207. In this case, the second chip electrode 212 may be disposed on the side opposite to the first chip electrode 211 or on the opposite side as illustrated in FIG. 6.

The second chip electrode 212, like the first chip electrode 211, may be composed of indium tin oxide (ITO) as a transparent electrode or thin film of Au or an alloy containing Au to minimize an interference of light emitted from the light-emitting diode 200.

The second chip electrode 212 may include a first portion 212A and a second portion 212B that may be electrically connected to the fourth substrate electrode pad 70, and the third portion 212c connected to the second semiconductor layer 203.

The first portion 212a of the second chip electrode 212 may cover a portion of the upper surface of the first semiconductor layer 201. The first portion 212a of the second chip electrode 212 may be electrically connected to the second portion 72 of the fourth substrate electrode pad 70 through a second wiring 312 (refer to FIG. 10). The second wiring 312 may be deposited in a form of a thin film on the first portion 212a of the second chip electrode 212 and the second portion 72 of the fourth substrate electrode pad 70. The second wiring 312 may be Au or an alloy containing Au.

The second portion 212b of the second chip electrode 212 may extend to the first portion 212a to cover side surfaces of the first semiconductor layer 201, the active layer 202, and the second semiconductor layer 203. The second portion 212b of the second chip electrode 212 may be electrically connected to the third portion 73 of the fourth substrate electrode pad 70 (refer to FIG. 9). As such, the second portion 212b of the second chip electrode 212 may have a length that can cover only the first semiconductor layer 201 or a length that can cover only the active layer 202. For example, the length of the second portion 212b of the second chip electrode 212 may be sufficient to be electrically connected to the third portion 73 of the fourth substrate electrode pad 70.

The third portion 212c of the second chip electrode 212 may extend to the first portion 212A to be connected to the second semiconductor layer 203.

The light-emitting diode 200 may be covered with an insulating film 230 on the upper and side surfaces. The insulating film 230 may be formed of an organic material or an inorganic material, and may have a structure in which an organic material and an inorganic material are repeatedly stacked.

Referring to FIG. 5, a first portion 212a of the second chip electrode 212 may be stacked on a portion of the insulating layer 230. However, the disclosure is not limited thereto, and a portion of the insulating film 230 on which the first portion 212a of the second chip electrode 212 is stacked may be omitted. Accordingly, the first portion 212a of the second chip electrode 212 may directly contact the second semiconductor layer 203.

Hereinafter, a repair process for replacing a defective light-emitting diode 100 using the light-emitting diode 200 according to an embodiment of the disclosure will be described with reference to the drawings.

Figure 7:
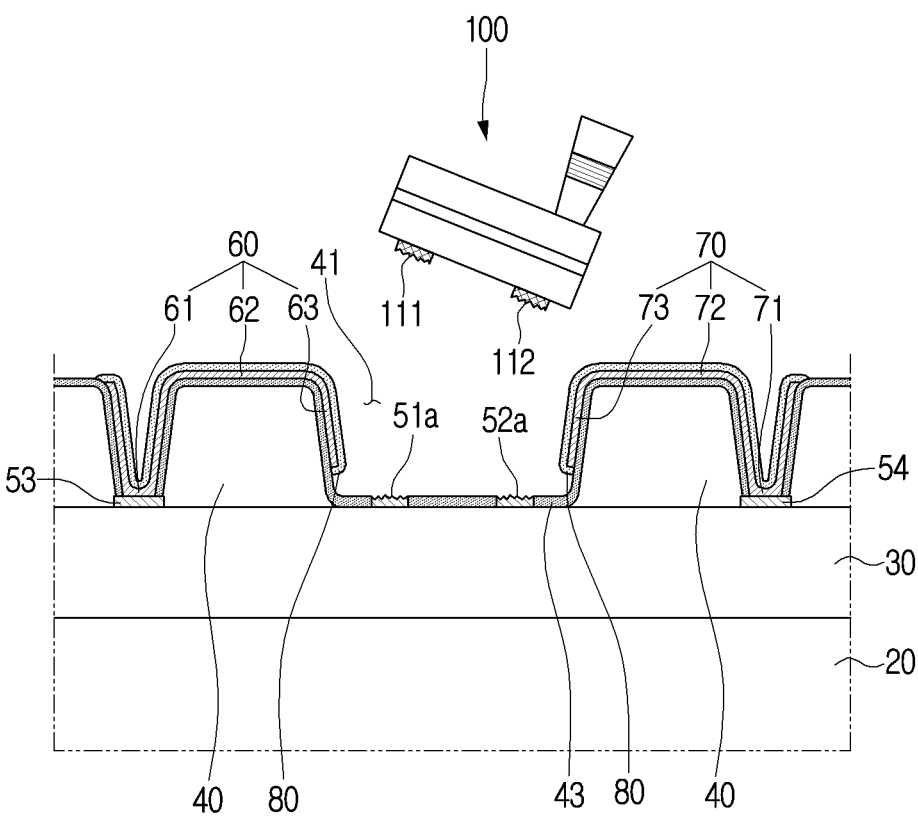
FIG. 7 is a view illustrating an example of removing a defective light-emitting diode from a substrate according to an embodiment.

FIG. 7 is a view illustrating an example of removing a defective light-emitting diode from a substrate according to an embodiment.

Referring to FIG. 7, when the defective light-emitting diode 100 is removed from the mounting groove 41, the first and second substrate electrode pads 51a and 51b are forcibly separated from the first and second chip electrodes 111 and 112 of the defective light-emitting diode 100, and as illustrated in FIG. 4, surfaces bonded to the first and second chip electrodes 111 and 112 may be damaged. Accordingly, the first and second substrate electrode pads Ma and Mb of the mounting groove 41 may not be reused.

In a state in which the defective light-emitting diode 100 is removed, a pre-work may be performed to mount an adequate light-emitting diode 200 for repair.

As a preliminary work, in order to use the light-emitting diode 200 according to an embodiment of the disclosure as a light-emitting diode for repair on the substrate 20, a portion of the insulating layer 80 may be removed to expose a portion of the third and fourth substrate electrode pads 60 and 70.

Figure 8:
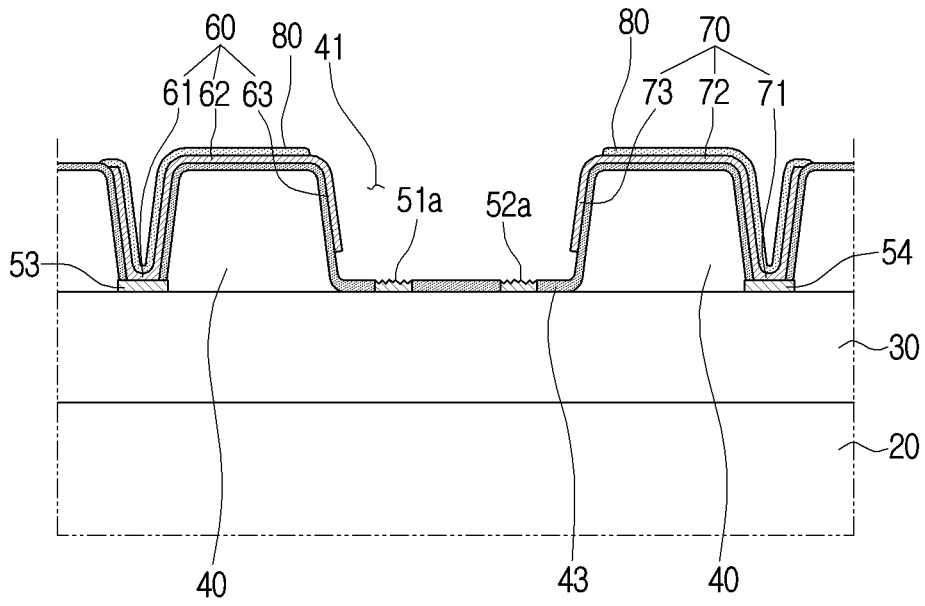
FIG. 8 is a view illustrating an example in which a portion of an insulating film covering a third substrate electrode pad and a fourth substrate electrode pad of a substrate is removed, respectively, according to an embodiment.

A portion of the insulating layer 80 to be removed may be determined according to a portion in which the first and second chip electrodes 211 and 212 of the light-emitting diode 200 contact each other. For example, as illustrated in FIG. 8, a portion of the insulating layer 80 covering the third portions 63 and 73 of the third and fourth substrate electrode pads 60 and 70 may be removed. The removed portions may respectively correspond to the second portion 211a of the first chip electrode 211 and the second portion 212a of the second chip electrode 212 to be electronically connected to the third and fourth substrate electrode pads 60 and 70.

An adhesive member (e.g., solder paste, etc.) may be applied to the third portions 63 and 73 of the third and fourth substrate electrode pads 60 and 70 from which the insulating layer 80 is removed before the light-emitting diode 200 is inserted into the mounting groove 41. The solder paste allows the first and second chip electrodes 211 and 212 of the light-emitting diode 200 to establish good electrical connection with the third and fourth substrate electrode pads 60 and 70.

Figure 9:
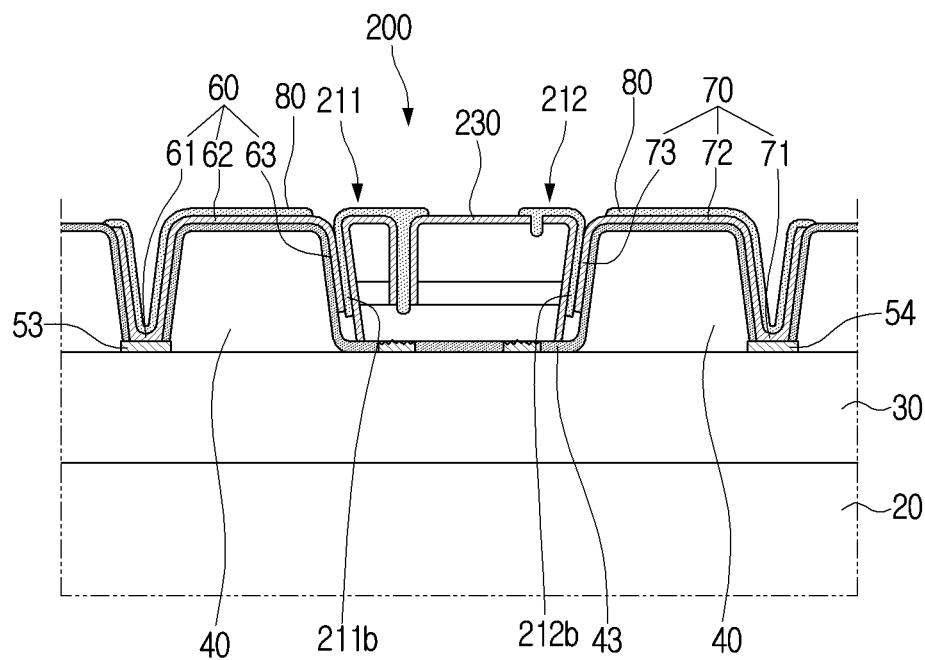
FIG. 9 is a view illustrating an example in which a light-emitting diode is disposed in a mounting groove of a substrate according to an embodiment.

FIG. 9 is a view illustrating an example in which a light-emitting diode is disposed in a mounting groove of a substrate according to an embodiment.

Referring to FIG. 9, the light-emitting diode 200 may be inserted into the mounting groove 41 from which the defective light-emitting diode 100 is removed.

In this case, the second portion 211b of the first electrode pad 211 of the light-emitting diode 200 may be in contact with the third portion 63 of the third substrate electrode pad 60, and the second portion 212b of the second electrode pad 212 of the light-emitting diode 200 may be in contact with the third portion 73 of the fourth substrate electrode pad 70.

In this state, the light-emitting diode 200 may be bonded to a substrate by a thermocompression method. In this case, the second portion 211b of the first electrode pad 211 of the light-emitting diode 200 may be fused with the third portion 63 of the third substrate electrode pad 60 to form a metal bonding state. Similarly, the second portion 212b of the second electrode pad 212 of the light-emitting diode 200 may be fused with the third portion 73 of the fourth substrate electrode pad 70 to form a metal bonding state. Accordingly, the first and second chip electrodes 211 and 212 of the light-emitting diode 200 inserted into the mounting groove 41 may be electrically connected to the third and fourth substrate electrode pads 60 and 70, respectively.

The light-emitting diode 200 according to an embodiment of the disclosure may be used for repair as described above, but is not limited thereto and may also be used for transfer. When the light-emitting diode 200 according to an embodiment of the disclosure is used for transfer, in the substrate 20 on which the light-emitting diode 200 is mounted, the first and second substrate electrode pads 51 and 52 (refer to FIG. 4) may be omitted. In this case, the first and second chip electrodes 211 and 212 of the light-emitting diode 200 may be electrically connected to the third and fourth substrate electrode pads 60 and 70 provided on the substrate 20 in as transfer process.

Hereinafter, an example that the first portions 211a and 212a of the first and second chip electrodes 211 and 212 of the light-emitting diode 200 are electrically connected to the portions 62 and 72 of the third and fourth substrate electrode pads 60 and 70 of the substrate 20, respectively.

Figure 10:
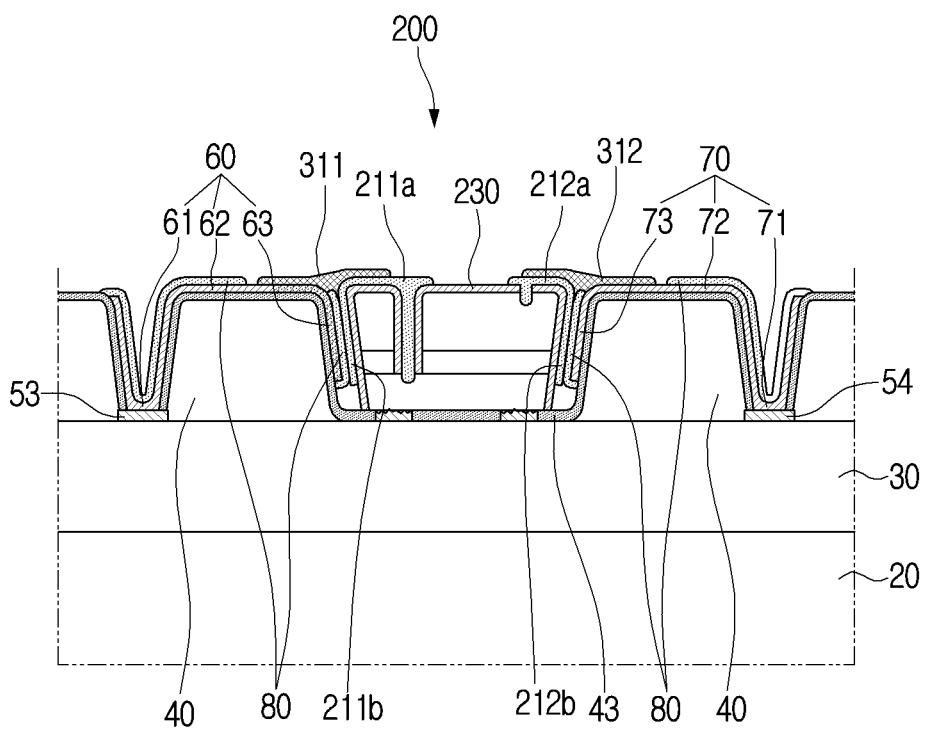
FIG. 10 is a view showing an example in which a first chip electrode and a second chip electrode of a light-emitting diode are electrically connected to a third substrate electrode pad and a fourth substrate electrode pad of a substrate, respectively, according to an embodiment.

FIG. 10 is a view showing an example in which a first chip electrode and a second chip electrode of a light-emitting diode are electrically connected to a third substrate electrode pad and a fourth substrate electrode pad of a substrate, respectively, according to an embodiment.

Referring to FIG. 10, the first portions 211a and 212a of the first and second chip electrodes 211 and 212 of the light-emitting diode 200 may remove a portion of the insulating layer 80 covering each of the second portions 62 and 72 of the third and fourth substrate electrode pads 60 and 70 in order to make electrical contact with the second portions 62 and 72 of the third and fourth substrate electrode pads 60 and 70.

The light-emitting diode 200 may be inserted into the mounting groove 41 from which the defective light-emitting diode 100 is removed.

The first portion 211a of the first chip electrode 211 of the light-emitting diode 200 may be electrically connected to the second portion 62 of the third substrate electrode pad 60 by the first wiring 311. Similarly, the first portion 212a of the second chip electrode 212 of the light-emitting diode 200 may be electrically connected to the second portion 72 of the fourth substrate electrode pad 70 by the second wiring 312.

In this case, as the first and second wirings 311 and 312 are applied to the upper side of the display panel 10, a bonding operation between the first and second chip electrodes 211 and 212 of the light-emitting diode 200, and the third and fourth electrode pads 60 and 70 may be easily performed. In this case, the first and second wirings 311 and 312 may be applied on the substrate by an inkjet method, and may be applied in various other ways.

The light-emitting diode 200 according to an embodiment of the disclosure may be used for transfer as described above.

When electrically connecting, during transfer, the first portions 211a and 212a of the first and second chip electrodes 211 and 212 of the light-emitting diode 200 and second portions 62 and 72 of the third and fourth substrate electrode pads 60 and 70, respectively, the first and second wirings 311 and 312 may be formed by a photolithography method.

For example, after each light-emitting diode 200 is inserted into the plurality of mounting grooves 41 through a transfer process, a photoresist film may be applied on the insulating layer 40 and upper surfaces of the plurality of light-emitting diodes 200.

After drying the photoresist film (e.g., drying by a soft bake method), after aligning a mask on the upper surface of the display panel 20, exposure may be performed through a plurality of openings formed in the mask and development may be performed. In this case, the photoresist film may be formed of a positive photoresist solution from which a light-receiving portion is removed.

A portion of the display panel 10 from which the photoresist is removed may be exposed to the outside. Then, after the photoresist film is cured and dried (e.g., by hard curing or hard bake method), the first and second wirings 311 and 312 may be deposited on the exposed portion. The first and second wirings 311 and 312 may be deposited on the first portions 211a and 212a of the first and second chip electrodes 211 and 212 of the light-emitting diode 200 and the second portion 62 and 72 of the third and fourth substrate electrode pads 60 and 70 by chemical vapor deposition (CVD) method or sputtering method.

Thereafter, the photoresist film remaining on the upper surface of the display panel 10 may be removed. The photoresist film may be removed by a method such as a liquid photoresist stripper or oxidizing the photosensitizer in an oxygen plasma system, but is not limited thereto, and the photoresist film may be removed by various methods.

As such, when manufacturing the display module 3 using the light-emitting diode 200 according to an embodiment of the disclosure, the substrate 20 to be used may omit the first and second chip electrodes 51 and 52 provided at a bottom of the mounting groove 41.

FIGS. 11A to 11D are views illustrating other shapes of a first chip electrode and a second chip electrode of a light-emitting diode according to various embodiments.

Figure 11A:
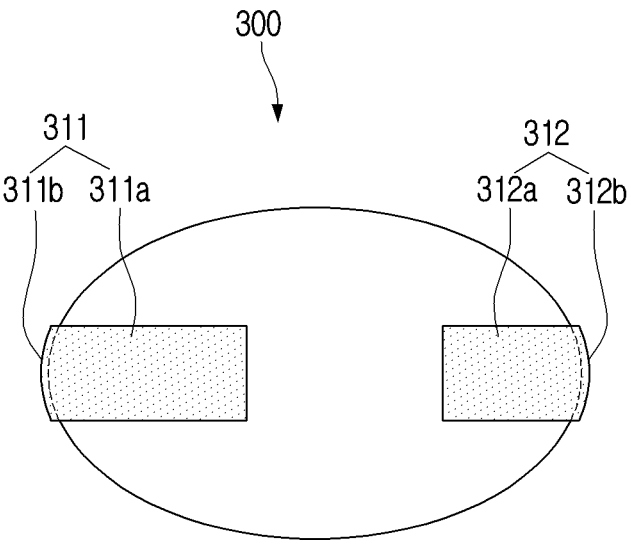
FIGS. 11A to 11D are views illustrating other shapes of a first chip electrode and a second chip electrode of a light-emitting diode according to various embodiments.

Referring to FIG. 11A, the light-emitting diode 300 may have an approximately elliptical shape similar to the light-emitting diode 200 described above. In this case, the first and second chip electrodes 311 and 312 may be disposed on both sides of the light-emitting diode. According to an embodiment, the first and second chip electrodes 311 and 312 may be disposed on both sides of the light-emitting diode in a substantially straight shape. That is, the first and second chip electrodes 311 and 312 may have substantially straight edges.

The first chip electrode 311 of the light-emitting diode 300 may include a first portion 311a disposed on the upper surface of the light-emitting diode 300 and a second portion 311b disposed on a side surface of the light-emitting diode 300. A third portion of the first chip electrode 311 may extend to the first portion 311*a* and be connected to the first semiconductor layer 201 (refer to FIG. 5) of the light-emitting diode 300.

The second chip electrode 312 of the light-emitting diode 300 may include a first portion 312*a* disposed on the upper surface of the light-emitting diode 300 and a second portion 312*b* disposed on a side surface of the light-emitting diode 300. A third portion of the second chip electrode 312 may extend to the first portion 312*a* and may be connected to the second semiconductor layer 203 (refer to FIG. 5) of the light-emitting diode 300.

Figure 11B:
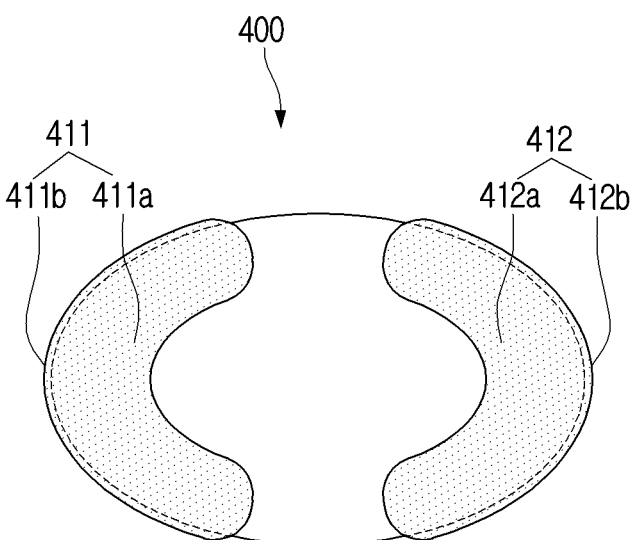

Referring to FIG. 11B, the light-emitting diode 400 may have an approximately elliptical shape similar to the light-emitting diode 200 described above. In this case, the first and second chip electrodes 411 and 412 may be disposed in a substantially arc shape along rounded portions on opposite sides of the light-emitting diode 400.

The first chip electrode 411 of the light-emitting diode 400 may include a first portion 411*a* disposed on an upper surface of the light-emitting diode 400 and a second portion 411*b* disposed on a side surface of the light-emitting diode 400. A third portion of the first chip electrode 411 may extend to the first portion 411*a* and may be connected to the first semiconductor layer 201 (refer to FIG. 5) of the light-emitting diode 400.

A second chip electrode 412 of the light-emitting diode 400 may include a first portion 412*a* on the upper surface of the light-emitting diode 400 and a second portion 412*b* disposed on the side surface of the light-emitting diode 400. A third portion of the second chip electrode 412 may extend to the first portion 412*a* and may be connected to the second semiconductor layer 203 (refer to FIG. 5) of the light-emitting diode 400.

Figure 11C:
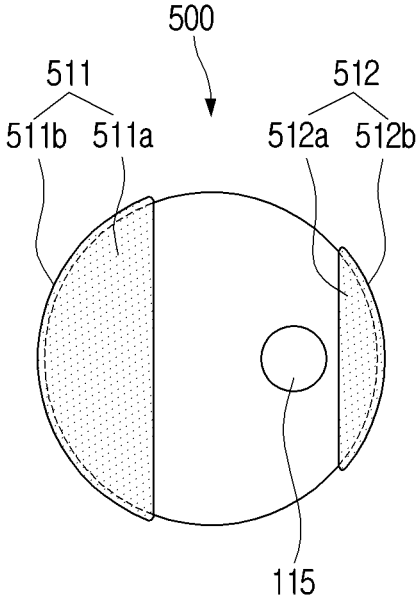

Referring to FIG. 11C, the light-emitting diode 500 may have a substantially circular shape, different from the light-emitting diode 200 described above, and may have a predetermined thickness. In this case, the first and second chip electrodes 511 and 512 may be disposed along rounded portions on opposite sides of the light-emitting diode 500.

The first chip electrode 511 of the light-emitting diode 500 may include a first portion 511*a* disposed on the upper surface of the light-emitting diode 500 and a second portion 511*b* disposed on a side surface of the light-emitting diode 500. A third portion of the first chip electrode 511 may extend to the first portion 511*a* and may be connected to the first semiconductor layer 201 (refer to FIG. 5) of the light-emitting diode 500.

The second chip electrode 512 of the light-emitting diode 500 may include a first portion 512*a* disposed on the upper surface of the light-emitting diode 500 and a second portion 512*b* disposed on a side surface of the light-emitting diode 500. A third portion of the second chip electrode 512 may extend to the first portion 512*a* and may be connected to the second semiconductor layer 203 (refer to FIG. 5) of the light-emitting diode 500.

Figure 11D:
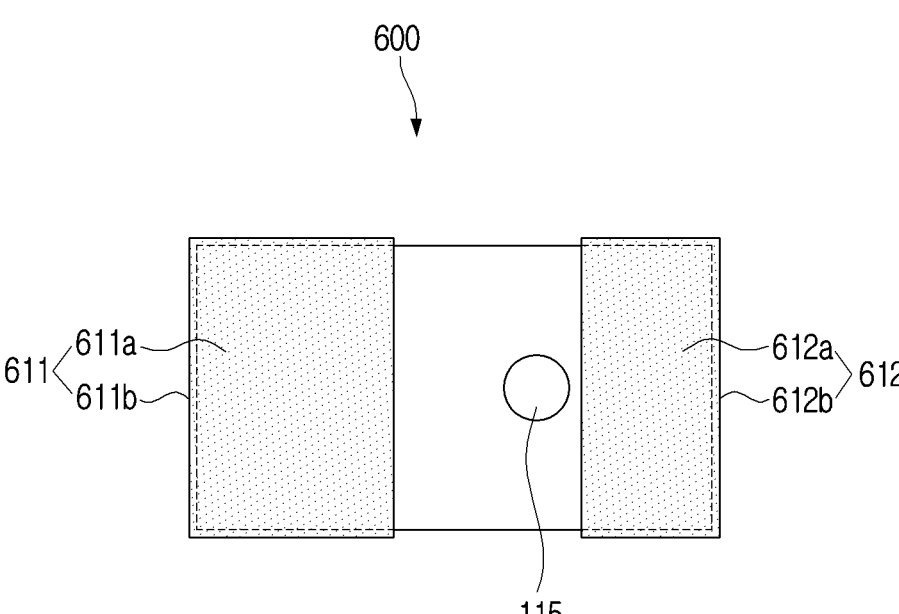

Referring to FIG. 11D, the light-emitting diode 600 may have a substantially rectangular shape, different from the light-emitting diode 200 describe above, and may have a predetermined thickness. In this case, the first and second chip electrodes 611 and 612 may be disposed along rounded portions on opposite sides of the light-emitting diode 600.

The first chip electrode 611 of the light-emitting diode 600 may include a first portion 611*a* disposed on the upper surface of the light-emitting diode 600 and a second portion 611*b* disposed on a side surface of the light-emitting diode 600. A third portion of the first chip electrode 611 may extend to the first portion 611*a* and may be connected to the first semiconductor layer 201 (refer to FIG. 5) of the light-emitting diode 600.

The second chip electrode 612 of the light-emitting diode 600 may include a first portion 612*a* disposed on the upper surface of the light-emitting diode 600 and a second portion 612*b* disposed on a side surface of the light-emitting diode 600. A third portion of the second chip electrode 612 may extend to the first portion 612*a* and may be connected to the second semiconductor layer 203 (refer to FIG. 5) of the light-emitting diode 600.

The foregoing embodiments and advantages are merely examples and are not to be construed as limiting the disclosure. The present teaching may be readily applied to other types of apparatuses. Also, the description of the embodiments of the disclosure is intended to be illustrative, and not to limit the scope of the claims, and many alternatives, modifications, and variations will be apparent to those skilled in the art.

What is claimed is:

1. A light-emitting diode comprising:
a first semiconductor layer;
an active layer provided on the first semiconductor layer;
a second semiconductor layer provided on the active layer;
a first chip electrode covering a first portion of a light-emitting surface of the second semiconductor layer and a portion of a first side surface of the second semiconductor layer; and
a second chip electrode covering a second portion of the light-emitting surface of the second semiconductor layer different from the first portion of the light-emitting surface of the second semiconductor layer and covering a second side surface of the second semiconductor layer different from the first side surface of the second semiconductor layer,
wherein the first chip electrode is provided on a first side surface of the active layer and a first side surface of the first semiconductor layer, and
wherein the second chip electrode is provided on a second side surface of the active layer and a second side surface of the first semiconductor layer.

2. The light-emitting diode of claim 1, wherein the first chip electrode comprises:
a first portion covering the first portion of the light-emitting surface of the second semiconductor layer;
a second portion extending from the first portion of the first chip electrode and covering the first side surface of the second semiconductor layer; and
a third portion extending from the first portion of the first chip electrode and connected to the first semiconductor layer.

3. The light-emitting diode of claim 2, wherein the second portion is configured to extend to a side of the active layer or a side of the first semiconductor layer.

4. The light-emitting diode of claim 2, further comprising:
an insulating layer provided between the third portion of the first chip electrode and the second semiconductor layer and between the third portion of the first chip electrode and the active layer such that the third portion is not in direct contact with the second semiconductor layer and the active layer.

5. The light-emitting diode of claim 2, wherein the third portion has a length equal to or greater than a combined height of the second semiconductor layer and the active layer such that the third portion reaches the first semiconductor layer.

6. The light-emitting diode of claim 1, wherein the second chip electrode comprises:

a first portion covering the second portion of the light-emitting surface of the second semiconductor layer; and a second portion extending from the first portion of the second chip electrode and covering the second side surface of the second semiconductor layer.

7. The light-emitting diode of claim 6, wherein the light-emitting diode further includes an insulating film covering the light-emitting surface of the second semiconductor layer and a side surface of the second semiconductor layer, and wherein the second chip electrode further includes a third portion extending from the first portion of the second chip electrode and connected to the second semiconductor layer through the insulating film.

8. The light-emitting diode of claim 1, wherein the first chip electrode and the second chip electrode are asymmetrically disposed with respect to the light-emitting diode.

9. The light-emitting diode of claim 1, wherein the first chip electrode and the second chip electrode are symmetrically disposed with respect to the light-emitting diode.

10. A display module comprising:

a substrate having a plurality of mounting grooves on one surface;

a plurality of light-emitting diodes configured to emit light and respectively mounted in the plurality of mounting grooves; and a driving circuit configured to generate driving signals of the plurality of light-emitting diodes, wherein each of the plurality of light-emitting diodes comprises:

a first semiconductor layer and a second semiconductor layer, an active layer provided between the first semiconductor layer and the second semiconductor layer, a first chip electrode covering a first portion of a light-emitting surface of the second semiconductor layer and a portion of a first side surface of the second semiconductor layer, and a second chip electrode covering a second portion of the light-emitting surface of the second semiconductor layer different from the first portion of the light-emitting surface of the second semiconductor layer and covering a second side surface of the second semiconductor layer different from the first side surface of the second semiconductor layer, and wherein each of the plurality of mounting grooves includes a first substrate electrode pad to which the first chip electrode is electrically connected, and a second substrate electrode pad to which the second chip electrode is electrically connected, and wherein the first chip electrode is provided on a first side surface of the active layer and a first side surface of the first semiconductor layer, and wherein the second chip electrode is provided on a second side surface of the active layer and a second side surface of the first semiconductor layer.

11. The display module of claim 10, wherein the first substrate electrode pad includes a first portion provided around one side of the respective mounting groove, and a second portion extending to the first portion and extending to an inner circumferential surface of the respective mounting groove.

12. The display module of claim 11, wherein the first portion or the second portion of the first substrate electrode pad is configured to be electrically connected to the first chip electrode.

13. The display module of claim 10, wherein the second substrate electrode pad includes a first portion provided around one side of the respective mounting groove, and a second portion extending to the first portion and extending to an inner circumferential surface of the respective mounting groove.

14. The display module of claim 11, wherein the first portion or the second portion of the first substrate electrode pad is configured to be electrically connected to the second chip electrode.

15. The display module of claim 10, wherein a portion of the first substrate electrode pad is not electrically connected to the first chip electrode and is configured to be covered by an insulating film, and a portion of the second substrate electrode pad is not electrically connected to the second chip electrode and is configured to be covered by the insulating film.

* * * * *